United States Patent
Romani et al.

(10) Patent No.: US 10,473,731 B2
(45) Date of Patent: Nov. 12, 2019

(54) MAGNETIC SENSOR READING DEVICE, SYSTEM AND METHOD

(75) Inventors: Carlo Alberto Romani, Cornaredo (IT); Enrico Pozzati, San Martino Siccomario (IT); Fabio Bottinelli, Malnate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 1213 days.

(21) Appl. No.: 13/302,944

(22) Filed: Nov. 22, 2011

(65) Prior Publication Data

US 2012/0158324 A1 Jun. 21, 2012

(30) Foreign Application Priority Data

Nov. 26, 2010 (IT) ............... TO2010A0942
Nov. 26, 2010 (IT) ............... TO2010A0943

(51) Int. Cl.
| | |
|---|---|
| *G06F 19/00* | (2018.01) |
| *G01R 33/00* | (2006.01) |
| *G01R 33/06* | (2006.01) |
| *G01R 33/09* | (2006.01) |
| *G01R 35/00* | (2006.01) |

(52) U.S. Cl.
CPC ..... *G01R 33/0035* (2013.01); *G01R 33/0023* (2013.01); *G01R 33/06* (2013.01); *G01R 33/09* (2013.01); *G01R 33/096* (2013.01); *G01R 33/0017* (2013.01); *G01R 35/00* (2013.01)

(58) Field of Classification Search
CPC .. G01R 35/00; G01R 35/005; G01R 33/0035; G01R 33/02; G01R 33/09; G01R 33/096; G01R 33/028

USPC .......................................................... 702/57
See application file for complete search history.

(56) References Cited

U.S. PATENT DOCUMENTS

| | | | |
|---|---|---|---|
| 4,706,138 A | 11/1987 | Jove et al. | |
| 4,847,584 A | 7/1989 | Pant | |
| 5,247,278 A | 9/1993 | Pant et al. | |
| 5,737,226 A * | 4/1998 | Olson ................. | G01C 17/38 701/530 |
| 6,566,856 B2 | 5/2003 | Sandquist et al. | |
| 7,053,607 B2 | 5/2006 | Sato | |
| 7,057,173 B2 | 6/2006 | Wright | |
| 7,746,065 B2 | 6/2010 | Pastre et al. | |
| 8,164,331 B2 | 4/2012 | Imai et al. | |
| 8,760,158 B2 | 6/2014 | Ichinohe et al. | |

(Continued)

FOREIGN PATENT DOCUMENTS

| | | |
|---|---|---|
| CN | 1695066 A | 11/2005 |
| CN | 1789920 A | 6/2006 |

(Continued)

*Primary Examiner* — Yoshihisa Ishizuka
(74) *Attorney, Agent, or Firm* — Seed IP Law Group LLP (57) ABSTRACT

A reading circuit for a magnetic-field sensor, provided with a detection structure generating an electrical detection signal as a function of an external magnetic field, has a signal-conditioning stage, which is electrically coupled to the detection structure and generates an output signal as a function of the electrical detection signal; the reading circuit is provided with a full-scale-control stage that is able to select automatically a full-scale value for the signal-conditioning stage, as a function of the value of the external magnetic field, such as to prevent saturation of the same conditioning stage.

18 Claims, 3 Drawing Sheets

(56) References Cited

U.S. PATENT DOCUMENTS

| | | | |
|---|---|---|---|
| 2006/0013420 A1* | 1/2006 | Sacha | H04R 25/43 381/312 |
| 2008/0054897 A1 | 3/2008 | Crolly et al. | |
| 2008/0177499 A1* | 7/2008 | Maone | G01P 13/02 702/147 |
| 2009/0001965 A1* | 1/2009 | Ausserlechner | G01D 5/145 324/202 |
| 2009/0212771 A1 | 8/2009 | Cummings et al. | |
| 2009/0224716 A1* | 9/2009 | Vig et al. | 318/550 |
| 2010/0010288 A1* | 1/2010 | Von Ohlsen | A61N 2/02 600/9 |
| 2010/0166122 A1 | 7/2010 | Pahuja et al. | |
| 2011/0133733 A1* | 6/2011 | Nagasaki | G01R 33/063 324/252 |
| 2012/0086438 A1* | 4/2012 | Tu | 324/202 |
| 2012/0153936 A1 | 6/2012 | Romani et al. | |
| 2012/0166122 A1 | 6/2012 | Bottinelli et al. | |

FOREIGN PATENT DOCUMENTS

| | | | | |
|---|---|---|---|---|
| CN | 1890576 A | 1/2007 | | |
| CN | 202748469 U | 2/2013 | | |
| EP | 2290389 A1 * | 3/2011 | | G01R 33/063 |
| JP | WO 2009154095 A1 * | 12/2009 | | G01R 33/063 |
| WO | 2005/054887 A1 | 6/2005 | | |

* cited by examiner

MAGNETIC SENSOR READING DEVICE, SYSTEM AND METHOD

BACKGROUND

Technical Field

The present disclosure relates to a reading circuit for a magnetic-field sensor, for example, an anisotropic magnetoresistive (AMR) magnetic sensor.

Description of the Related Art

Magnetic-field sensors, in particular AMR magnetic sensors are used in a plurality of fields and systems, for example in compasses, in systems for detecting ferrous materials, in the detection of currents, and in a wide range of other applications, thanks to their capacity for detecting natural magnetic fields (for example the Earth's magnetic field) and magnetic fields generated by electrical components (such as electrical or electronic devices and lines traversed by electric current).

In a known way, the phenomenon of anisotropic magnetoresistivity occurs within particular ferrous materials, which, when subjected to an external magnetic field, undergo a variation of resistivity as a function of the characteristics of the same external magnetic field. Usually, these materials are applied in the form of thin strips so as to form resistive elements, and the resistive elements thus formed are electrically connected to form a bridge structure (typically a Wheatstone bridge).

It is also known to manufacture AMR magnetic sensors with standard techniques of semiconductor micromachining, as described for example in U.S. Pat. No. 4,847,584. In particular, each magnetoresistive element can be formed by a film of magnetoresistive material, such as for example Permalloy (a ferromagnetic alloy containing iron and nickel), deposited to form a thin strip on a substrate made of semiconductor material, for example silicon.

When an electric current is made to flow through a magnetoresistive element, the angle $\theta$ between the direction of magnetization of the magnetoresistive element and the direction of the current flow affect the effective value of resistivity of the magnetoresistive element so that, as the value of the angle $\theta$ varies, the value of electrical resistance varies (in detail, this variation follows a law of the $\cos^2\theta$ type). For example, a direction of magnetization parallel to the direction of the current flow results in a maximum value of resistance to the passage of current through the magnetoresistive element, whilst a direction of magnetization orthogonal to the direction of the current flow results in a minimum value of resistance to the passage of current through the magnetoresistive element.

Figure 1:
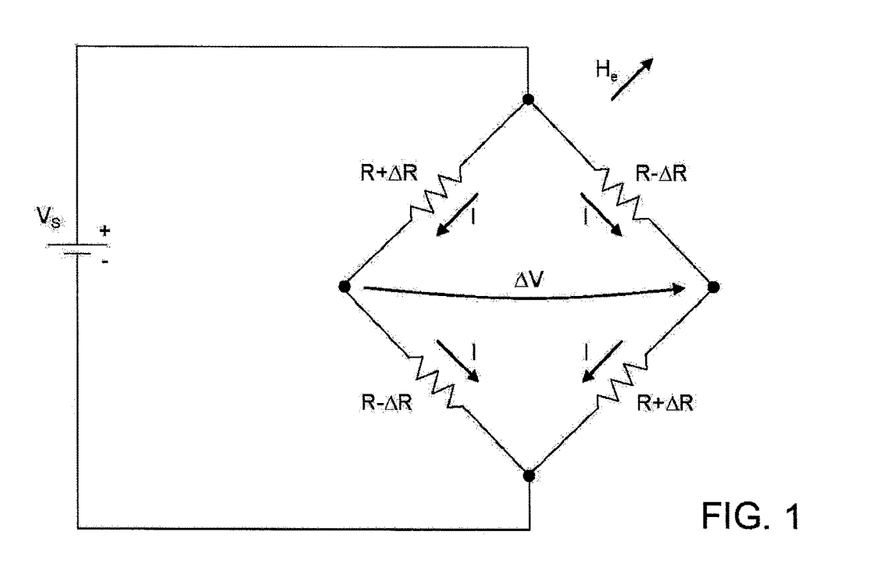
FIG. 1 shows a simplified equivalent electrical diagram of a detection structure of an AMR magnetic sensor, of a known type.

In particular, the Wheatstone-bridge detection structure (which may be defined as "microelectromagnetic") of an AMR magnetic sensor includes magnetoresistive elements that have ideally the same resistance value and are such as to form diagonal pairs of equal elements, which react in an opposite way with respect to one another to the external magnetic fields, as shown schematically in FIG. 1 (where I is the electric current flowing in the magnetoresistive elements and R the common resistance value).

If a supply voltage $V_s$ is applied at the input of the bridge detection structure (in particular to the first two terminals of the bridge, which operate as input terminals), in the presence of an external magnetic field $H_e$, a variation of resistance $\Delta R$ of the magnetoresistive elements occurs and a corresponding variation of the voltage drop on the same magnetoresistive elements. In fact, the external magnetic field $H_e$ determines a variation of the direction of magnetization of the magnetoresistive elements. This results in an unbalancing of the bridge, which causes a voltage variation $\Delta V$ at output from the bridge circuit (in particular between the remaining two terminals of the bridge, which operate as output terminals). Since the direction of the initial magnetization of the magnetoresistive elements is known beforehand, as a function of the voltage variation $\Delta V$ it is thus possible to determine the component of the external magnetic field acting in the direction of sensitivity of the magnetic sensor (therefore, using three magnetic sensors with directions of sensitivity orthogonal to one another, it is possible to determine the modulus and direction of the external magnetic field).

In particular, in order to detect unbalancing of the Wheatstone bridge and generate an electrical output signal indicating the characteristics of the external magnetic field to be measured, a reading circuit (or front-end) is normally used, which is coupled to the output of the detection structure of the AMR magnetic sensor and includes a signal-conditioning stage, comprising amplification and filtering units. The detection structure and the associated reading circuit together form the magnetic-field sensor, which supplies at output an electrical signal as a function of the detected magnetic field, and has a given input/output response, due in part to the sensitivity of the bridge detection structure, and in part to the gain of the associated reading circuit.

In many applications in which AMR magnetic sensors are normally used, disturbance magnetic fields, usually known as "stray fields" are superimposed on the magnetic signals to be detected; the value of these stray fields may even be comparable to, if not higher than, that of the signals to be detected. The stray magnetic fields, due to the operating environment of the magnetic sensors, act as an offset that is superimposed upon the useful signal to be detected.

For example, AMR magnetic sensors find advantageous application, in particular as compasses, in mobile-phone systems. In these applications, the stray magnetic fields are generated by the same electronic or mobile-phone devices in which the magnetic sensors are incorporated (in particular, with the transceiving antenna operatively active), and may be oriented in the direction of detection of the AMR magnetic sensors. In this case, the value of the useful magnetic field to be detected is, for example, in the region of 0.6 gauss (Earth's magnetic field), whilst the stray magnetic field generated by the electronic or mobile-phone devices can even reach high values, for example 4 gauss.

It follows that a selection in the design stage of the full-scale value of the AMR magnetic sensor, made as a function of the useful signal to be detected, can lead to saturation of the sensor (in particular of the corresponding electronic reading circuit), in the presence of stray magnetic fields having a high value. This saturation in turn entails the impossibility of carrying out a correct reading of the useful magnetic field to be detected.

In particular, the reading circuit typically comprises an analog part for signal conditioning (in terms of amplification and filtering), and possibly a part for analog-to-digital conversion, which supplies the output signals. Usually, it is the output analog-to-digital conversion unit that saturates up to the full-scale value, in the presence of stray components (the analog part may be designed for working in linear dynamics for intervals greater than the maximum dynamics of the analog-to-digital converter). Alternatively, the reading circuit may include just the analog part, and be externally provided with an appropriate analog-to-digital conversion unit. Also in this case, saturations of the analog reading chain may occur in the presence of stray magnetic fields.

To overcome the above drawback, it is possible to use higher full-scale values so as to prevent any saturation during reading, at the expense, however, of obtaining generally lower values of resolution in the detection of the magnetic fields. In fact, in a known way, the full scale of the sensors, in addition to indicating a maximum value of the detectable magnetic field, is in general associated to the measurement resolution, the dynamics of a corresponding output signal being fixed. In other words, an increase in the full scale is to be considered equivalent to a decrease in the resolution of the sensor (for example, in the digital case, this is due to the presence of a higher full scale given the same quantization levels of the analog-to-digital converter). This reduction in the electrical performance of the sensors may, however, not be acceptable, in particular in those applications requiring an accurate measurement of the magnetic field to be detected, such as, for example, in magnetometers.

Moreover, given the unpredictability of the stray magnetic fields that may be superimposed on the useful signal during the effective conditions of use of the associated electronic device (for example, the aforesaid mobile-phone device), it is not in any case convenient to select beforehand, for example in the design stage, an adequate full-scale value for the AMR magnetic sensor, nor ensure, in all the possible conditions of use, the absence of saturation of the corresponding electronic reading circuit.

AMR magnetic sensors that have been so far proposed are hence not altogether satisfactory and optimized as regards the selection of the full-scale value, and frequently are unable to ensure the desired results in terms of the corresponding electrical performance.

BRIEF SUMMARY

According to an embodiment, a reading circuit for a magnetic-field sensor and a corresponding magnetic-field sensor are provided.

In an embodiment, a reading circuit for a magnetic-field sensor, said magnetic-field sensor comprising a detection structure, configured to generate an electrical detection quantity as a function of an external magnetic field, comprises a signal processing stage, designed to be electrically coupled to said detection structure and configured to generate an output signal as a function of said electrical detection quantity, and a full-scale control stage, operatively coupled to said signal processing stage and configured to automatically select an optimized full-scale value of said signal processing stage based on the value of said external magnetic field, such as to prevent saturation of said signal processing stage. In an embodiment, said full-scale control stage is integrated with said signal processing stage in a first die of semiconductor material, and is configured to generate and send to said signal processing stage a command signal such as to select said full-scale value of said signal processing stage. In an embodiment, said signal processing stage comprises an amplification unit with electronically variable and selectable amplification gain, and said command signal generated by said full-scale control stage is designed to vary a value of said amplification gain in order to select said full-scale value; said optimized full-scale value being a minimum selectable value, such as to prevent saturation of said signal processing stage. In an embodiment, said full-scale control stage is configured to run an iterative algorithm that envisages verifying the possible presence of saturation of said output signal, and modifying, in successive steps, the full-scale value of said signal processing stage, until a condition of absence of saturation of said output signal is determined, a condition to which said optimized full-scale value corresponds. In an embodiment, said iterative algorithm, designed to be run by said full-scale control stage, envisages: acquiring said output signal generated by said signal processing stage, in the presence of a first full-scale value; in the case where said full-scale control stage verifies a saturation of said output signal, incrementing the value of said full scale; repeating iteratively the operations of acquiring said output signal and incrementing the value of said full scale until said condition of absence of saturation is determined, to which said optimized full-scale value corresponds. In an embodiment, said first value corresponds to a minimum implementable value, or else to a design value, of said full scale of said signal processing stage. In an embodiment, said full-scale control stage is configured to: monitor repeatedly the value of said output signal; upon detection of a condition of saturation of said output signal, verifying, in a preliminary step, the possibility of selecting said optimized full-scale value, by verifying that the output signal of said signal processing stage will not saturate in the presence of a maximum settable value of said full scale; and, in the case of positive outcome of the verification of said possibility, selecting said optimized full-scale value of said signal processing stage. In an embodiment, said full-scale control stage is configured to: monitor repeatedly the value of said output signal; detect a condition in which said output signal is lower than a design full-scale value of said signal processing stage; and, upon detection of said condition, assign to the full scale of said signal processing stage said design full-scale value. In an embodiment, said full-scale control stage has an enabling input, designed to receive an enable information, and is moreover configured to carry out the automatic selection of said optimized full-scale value upon reception of said enabling information having a given enabling value. In an embodiment, said external magnetic field is to comprise, in given operating conditions: a useful component that is to be detected; and a component of disturbance, such as to cause said saturation of said signal processing stage.

In an embodiment, a magnetic-field sensor comprises a detection structure configured to generate an electrical detection quantity as a function of an external magnetic field, and a reading circuit as described herein. In an embodiment, said detection structure comprises magnetoresistive elements arranged to form a bridge detection structure; wherein said electrical detection quantity is a unbalancing signal of said bridge detection structure. In an embodiment, said detection structure is made in at least one second die made of semiconductor material, arranged with said first die inside a single package, to provide a chip of said magnetic-field sensor. In an embodiment, an electronic device comprises a magnetic-field sensor as described herein; said electronic device further comprising a management unit, coupled to said reading circuit of said magnetic-field sensor for receiving said output signal. In an embodiment, said full-scale control stage has an enabling input, designed to receive an enabling information, and is further configured to carry out the automatic selection of said optimized full-scale value based on the value of said enabling information; and wherein said management unit is configured to send said enabling information to said full-scale control stage of said reading circuit.

In an embodiment, a reading circuit comprises: a signal processing stage configured to receive a detection signal indicative of one or more characteristics of a magnetic field and to generate an output signal as a function of said detection signal; and a full-scale control stage communicatively coupled to said signal processing stage and configured to automatically select a full-scale value of said signal processing stage based on the output signal. In an embodiment, said full-scale control stage is integrated with said signal processing stage in a first die of semiconductor material, and is configured to generate and to send to said signal processing stage a command signal based on the selected full-scale value of said signal processing stage. In an embodiment, said signal processing stage comprises an amplification unit having an electronically variable and selectable amplification gain, and said amplification stage is configured to vary a value of said amplification gain based on the command signal, the selected full-scale value being a minimum value selected from a set of values which prevents saturation of said signal processing stage. In an embodiment, said full-scale control stage is configured to iteratively modify in successive steps, the selected full-scale value of said signal processing stage, until an absence of saturation of said output signal is detected. In an embodiment, said iteratively modifying comprises: selecting a first full-scale value; determining whether saturation of the signal processing stage is present at the first full-scale value based on the output of the signal processing stage; and when it is determined that saturation of the signal processing stage is present, incrementing the first full-scale value. In an embodiment, said first full-scale value is one of: a minimum selectable value and a default value. In an embodiment, said full-scale control stage is configured to: monitor the output signal to determine whether saturation of the signal processing stage is present at the selected full-scale value; and when it is determined that saturation of the signal processing stage is present at the selected full-scale value, determine whether saturation is present at a largest available full-scale value. In an embodiment, the full-scale control stage is configured to, when it determined that saturation is not present at the largest selectable full-scale value, increment the selected full-scale value. In an embodiment, said full-scale control stage is configured to: periodically monitor the output signal to determine whether saturation of the signal processing stage is present at the selected full-scale value; and when saturation is not detected, determine whether the selected full-scale is lower than a default value; and if the selected full-scale value is lower than the default value, reset the selected full-scale value to the default value. In an embodiment, said full-scale control stage has an enabling input and is configured to carry out the automatic selection of said full-scale value in response to reception of an enable signal. In an embodiment, said magnetic field comprises a useful component and a component of disturbance.

In an embodiment, a system comprises: a detection structure configured to generate an electrical detection signal as a function of a magnetic field; and a reading circuit, including: a signal processing stage configured to generate an output signal based on the electrical detection signal generated by the detection structure; and a full-scale control stage communicatively coupled to said signal processing stage and configured to automatically select a full-scale value of said signal processing stage based on the output signal. In an embodiment, said full-scale control stage is integrated with said signal processing stage in a first die of semiconductor material, and is configured to generate and to send to said signal processing stage a command signal based on the selected full-scale value of said signal processing stage. In an embodiment, said signal processing stage comprises an amplification unit having an electronically variable and selectable amplification gain, and said amplification stage is configured to vary a value of said amplification gain based on the command signal, the selected full-scale value being a minimum value selected from a set of values which prevents saturation of said signal processing stage. In an embodiment, said full-scale control stage is configured to iteratively modify the selected full-scale value of said signal processing stage, until an absence of saturation of said output signal is detected. In an embodiment, said iteratively modifying comprises: selecting a first full-scale value; determining whether saturation of the signal processing stage is present at the first full-scale value based on the output of the signal processing stage; and when it is determined that saturation of the signal processing stage is present, incrementing the first full-scale value. In an embodiment, said first full-scale value is one of: a minimum selectable value and a default value. In an embodiment, said full-scale control stage is configured to: monitor the output signal to determine whether saturation of the signal processing stage is present at the selected full-scale value; and when it is determined that saturation of the signal processing stage is present at the selected full-scale value, determine whether saturation is present at a largest selectable full-scale value; and when it determined that saturation is not present at the largest selectable full-scale value, increment the selected full-scale value. In an embodiment, said detection structure comprises magnetoresistive elements configured to form a bridge detection structure and said electrical detection is a signal indicative of an unbalancing of said bridge detection structure. In an embodiment, said detection structure is made in at least one second die made of semiconductor material, arranged with said first die inside a single package, to form a magnetic-field sensor chip. In an embodiment, the system further comprises a management unit, coupled to said reading circuit and configured to receive said output signal. In an embodiment, said full-scale control stage has an enabling input and said management unit is configured to send an enabling signal to said full-scale control stage of said reading circuit.

In an embodiment, a method comprises: receiving an electrical detection signal indicative of at least one characteristic of a magnetic field; generating, using a reading circuit, an output signal based on the electrical detection signal; and selecting a full-scale value of said reading circuit based on the output signal. In an embodiment, the selecting the full-scale value comprises selecting a minimum value from a set of values at which saturation of said reading circuit is not detected. In an embodiment, the selecting the full-scale value comprises iteratively modifying a full-scale value of said reading circuit until an absence of saturation of said output signal is detected. In an embodiment, said iteratively modifying comprises: selecting a first full-scale value; determining whether saturation of the reading circuit is present at the first full-scale value based on the output of the reading circuit; and when it is determined that saturation of the reading circuit is present, incrementing the first full-scale value. In an embodiment, said first full-scale value is one of: a minimum selectable value and a default value. In an embodiment, the method comprises: monitoring the output signal to detect saturation of the reading circuit; and when saturation of the reading circuit is detected, determining whether saturation is present at a largest selectable full-scale value; and when it determined that saturation is not present at the largest selectable full-scale value, incrementing the selected full-scale value. In an embodiment, the method further comprises: generating the electrical detection signal.

In an embodiment, a system comprises: means for generating an output signal based on an electrical detection signal indicative of at least one characteristic of a magnetic field; and means for selecting a full-scale value of said means for generating. In an embodiment, the system further comprises: means for generating the electrical detection signal. In an embodiment, the system further comprises: means for receiving the output signal.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

In the following description, certain details are set forth in order to provide a thorough understanding of various embodiments of devices, methods and articles. However, one of skill in the art will understand that other embodiments may be practiced without these details. In other instances, well-known structures and methods associated with, for example, magnetic sensors, amplifiers, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements may be enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a reference to square-shaped does not mean that an element has a geometrically perfect square shape.

An embodiment applies to a magnetic-field sensor, in particular an AMR magnetic sensor having a detection structure of the type described with reference to FIG. 1, and envisages implementation of a reading circuit, associated to the detection structure, which comprises a full-scale-control stage that is able to adjust automatically the full-scale value implemented by the reading circuit, selecting an appropriate value thereof as a function of the effective conditions of use so as to prevent saturation at the output.

Figure 2:
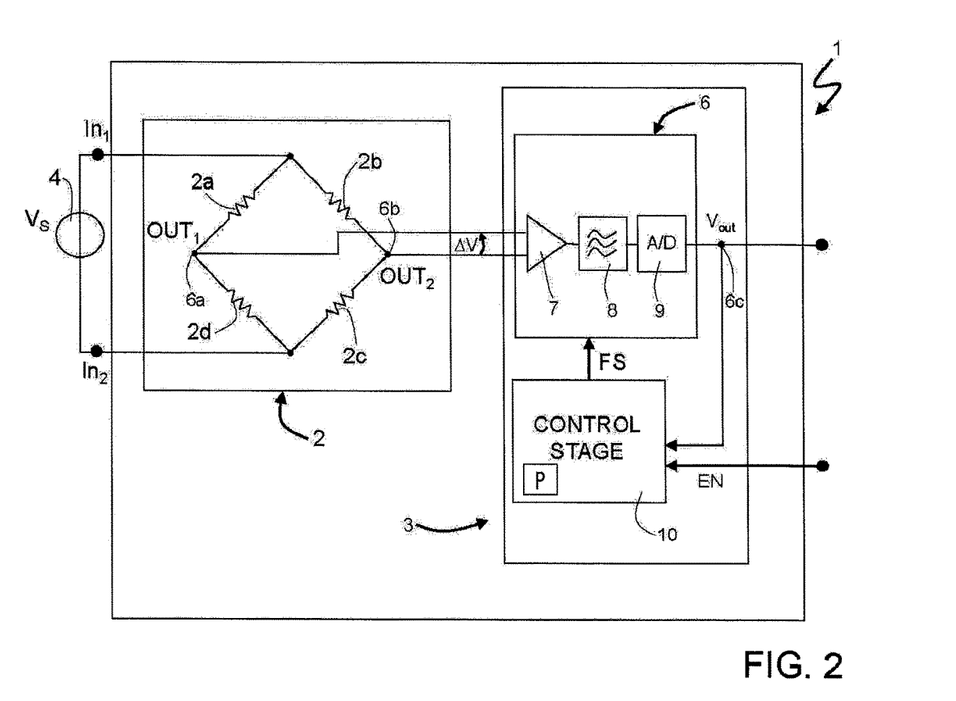
FIG. 2 shows a simplified diagram of a reading circuit of a magnetic-field sensor, in particular an AMR magnetic sensor, according to one embodiment.

In detail, FIG. 2 is a schematic illustration of a magnetic-field sensor (in particular an AMR magnetic sensor) according to one embodiment, designated as a whole by 1, including a detection structure, designated by 2 and represented schematically by a Wheatstone-bridge equivalent circuit, and a reading circuit (or front-end) 3, associated to the detection structure 2.

Conveniently, the detection structure 2 and the corresponding reading circuit 3 can be manufactured, through semiconductor micromachining techniques, within respective dice of semiconductor material, for example silicon (the reading circuit 3 being provided as, for example, an ASIC—Application-Specific Integrated Circuit), and integrated within one and the same package (so as to form the magnetic-field sensor 1 in a single chip). The detection structure 2 can possibly be provided in two or more dice of semiconductor material, for example each integrating a part sensitive to a respective detection direction (in the case of sensors with a plurality of detection axes).

In particular, the detection structure 2, in the Wheatstone-bridge configuration, comprises four magnetoresistive elements $2a$-$2d$, which are, for example, constituted by strips of a thin film of magnetoresistive material, such as Permalloy (a nickel iron magnetic alloy), etc., having one and the same resistance value at rest R (in the absence of external magnetic fields), and are designed to undergo in pairs one and the same variation $\Delta R$ in the presence of an external magnetic field $H_e$ (the pairs are formed by the elements facing in diagonal in the bridge; namely, a first pair is formed by the magnetoresistive elements $2a$, $2c$, and a second pair by the magnetoresistive elements $2b$, $2d$).

The detection structure 2 has a first input terminal $In_1$, designed to be connected to the positive pole of a supply source 4, which supplies a supply voltage $V_s$, and a second input terminal $In_2$, designed to be connected to the negative pole of the same supply source 4 (for example, coinciding with a ground terminal of the reading circuit 3). The detection structure 2 moreover has a first output terminal $Out_1$ and a second output terminal $Out_2$, across which the electrical unbalancing signal is present (i.e., the voltage variation $\Delta V$), which is a function, in particular, of the characteristics of the external magnetic field $H_e$ that is to be detected (and possibly superimposed on which is a stray magnetic field, acting substantially as an offset).

The reading circuit 3 comprises a conditioning stage 6, which is electrically coupled to the output of the detection structure 2 and includes, in the embodiment illustrated schematically in FIG. 2, appropriate amplification and filtering units 7, 8 for conditioning the signal of voltage variation $\Delta V$ that it receives across its two inputs $6a$, $6b$, which are connected respectively to the first output terminal $Out_1$ and to the second output terminal $Out_2$.

The conditioning stage 6 further comprises at the output an analog-to-digital conversion (ADC) unit 9, which supplies on an output $6c$ an output signal Vout, in this case of a digital type, the value of which is a function of the voltage variation ΔV generated by the detection structure 2 (in a way not illustrated, the conditioning stage 6 may alternatively be of a "fully differential" type, i.e., having a pair of differential outputs across which the output signal Vout is present).

The output 6c of the conditioning stage 6 moreover represents the output of the magnetic-field sensor 1 towards the external environment, for example for the connection to an external electronic management unit (here not illustrated) of an electronic device that incorporates the same magnetic-field sensor 1. In a way not illustrated, the reading circuit 3 can moreover supply at output, outside the magnetic-field sensor 1, an analog signal, as an alternative, or in addition to, the output signal Vout of a digital type.

According to an embodiment, the reading circuit 3 further comprises a full-scale-control stage 10, operatively coupled to the conditioning stage 6, for varying a full-scale value thereof and hence the conditions of detection of the magnetic field. In particular, the full-scale-control stage 10 generates a command signal FS, which is supplied to the conditioning stage 6 for adjusting the full-scale value thereof.

The command signal FS can, for example, act on a gain factor of the amplification unit 7 internal to the conditioning stage 6 (typically constituting a first input block of the same conditioning stage 6); the amplification unit 7 thus has for this purpose variable and selectable gain, for example, in so far as it comprises a resistive network with selectable resistance, or a capacitive network with selectable capacitance (in a way in itself known and not described in detail herein).

According to the requirements and the different applications and conditions of use, via the command signal FS, the full-scale-control stage 10 is hence able to vary the full-scale value of the conditioning stage 6, consequently varying the resolution thereof, between a minimum value, for example equal to 1 gauss, and a maximum value, for example equal to 8 gauss. The variation between the minimum value and the maximum value can, for example, be performed in steps of a pre-set value, whether constant or variable.

The full-scale-control stage 10, for example including a microprocessor, a microcontroller, a programmable logic unit, or a similar computing tool (as illustrated, a processor P), has a first input connected to the output 6c of the conditioning stage 6 and receiving the output signal Vout (in this case of a digital type), and a second input receiving an enabling information EN from the outside (in the form of an appropriate input signal or datum). The full-scale-control stage 10 is further provided with an output, which is connected to the conditioning stage 6 and supplies the aforesaid command signal FS.

In particular, the full-scale-control stage 10 is configured to execute an appropriate algorithm for selecting autonomously, via the command signal FS, the full-scale value most appropriate for the conditioning stage 6, such as not to cause saturation thereof and at the same time such as to facilitate electrical performance (in terms of full scale and resolution of detection) adequate for the effective conditions of use. In particular, the full-scale-control stage 10 may operate automatically in determining the aforesaid full-scale value, without the need for any selection by the user of the electronic device to which the magnetic-field sensor 1 is associated. In particular, the optimized full-scale value can be the minimum full-scale value, amongst the ones selectable, that is such as not to cause saturation of the reading circuit 3.

According to the specific applications and requirements, the aforesaid algorithm may be executed autonomously by the full-scale-control stage 10, for example at each turning-on of the electronic device incorporating the magnetic-field sensor 1, or else can be executed according to the value of the enabling information EN received from the outside (for example from the management unit of the electronic device). Advantageously, in the case where the control stage is enabled, the latter can activate automatically the algorithm in the event of occurrence of saturation at output, possibly communicating to the outside that a saturation has occurred and that the full-scale value has consequently been changed (also communicating the new full-scale value selected). Moreover, the procedure of selection of the optimized full-scale value can be carried out on demand, i.e., following upon a request imparted by the user of the electronic device (that results, via the management unit of the electronic device, in sending of the enabling information EN to the full-scale-control stage 10). This may occur for example in the case where it is the user who realizes the presence of saturation at output.

In one embodiment, described in detail hereinafter, the algorithm can moreover operate continuously, by verifying continuously in time, with a given rate (in terms of output data rate), the possible presence of saturation, and determining each time the optimized full-scale value.

In one embodiment, the algorithm executed by the full-scale-control stage 10 for selection of the optimized full-scale value envisages starting from a first full-scale value of the conditioning stage 6, and increasing progressively (for example, in pre-defined steps) the full-scale value, until the magnetic signal (comprising the useful magnetic field to be detected and the stray magnetic field) is detected without saturation of the reading circuit 3. In this way, it is possible to determine the minimum full-scale value of the available values that prevents saturations and enables reading with adequate electrical characteristics of the magnetic signals.

Figure 3:
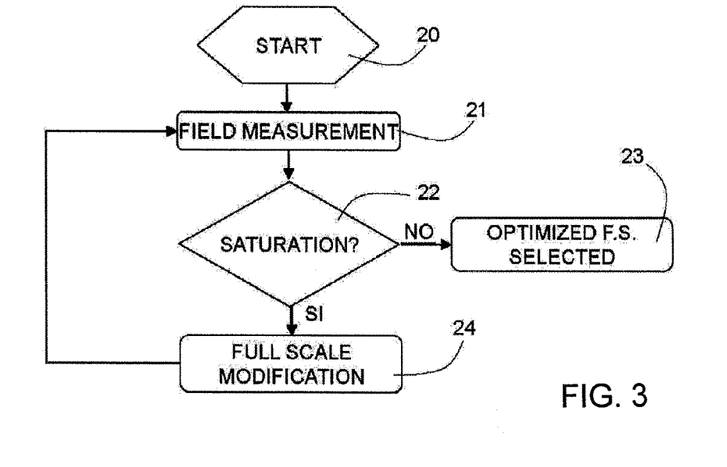
FIGS. 3 and 4 show flowcharts corresponding to different embodiments of an algorithm implemented by a full-scale control stage in the reading circuit of FIG. 2.

In greater detail, and as illustrated in FIG. 3, the algorithm of selection of the optimized full-scale value for the magnetic-field sensor 1 envisages the operations described hereinafter, which are carried out within the full-scale-control stage 10. The operations are executed iteratively, each time varying the full-scale value of the conditioning stage 6, via a corresponding variation of the command signal FS, until the optimized full-scale value is reached.

In an initial step of the algorithm, which is designated as a whole by 20, the operations of selection of the optimized full-scale value for the reading circuit 3 (and for the corresponding conditioning stage 6) are started, according to the modalities indicated previously. In particular, there is initial selection, via a first value of the command signal FS, of a first full-scale value, for example: a minimum value from among the ones that can be selected and implemented in the conditioning stage 6; or else, advantageously, a default full-scale value, which as per design is deemed suitable for the normal conditions of operation of the sensor (i.e., in the absence of stray magnetic fields); or, alternatively, a current full-scale value.

Next (step 21), the full-scale-control stage 10 controls execution of a measurement of the output signal Vout supplied by the reading circuit 3 coupled to the detection structure 2 of the magnetic-field sensor 1; in particular, the output signal Vout is a function of the overall magnetic field detected by the detection structure 2, and hence depends upon the effective conditions of use and the possible presence of stray magnetic fields. It should be noted that, in the digital implementation described herein, in this step a first sample of the aforesaid output signal Vout is acquired.

Next (step 22), the full-scale-control stage 10 verifies that the reading circuit 3 does not saturate, for example by verifying that the output signal Vout supplied by the conditioning stage 6 does not correspond to a saturated value (for example coinciding with a value corresponding to a maximum digital value that can be obtained with the number of bits used in the analog-to-digital conversion, namely, a digital number in which all the bits have the value "1", or to a minimum value digital, i.e., a digital number in which all the bits have the value "0"). More in general, it may be verified that the output signal Vout does not exceed a threshold, decided as indicating saturation.

In the case where the full-scale-control stage 10 verifies the absence of saturation (step 23), it determines that the optimized full-scale value has been selected, and interrupts the operations.

Otherwise, in the case where the full-scale-control stage 10 verifies the presence of saturation (step 24), it controls selection of a different full-scale value for the conditioning stage 6 of the reading circuit 3 by generating and sending to the same conditioning stage 6 a command signal FS of a value appropriately modified with respect to the preceding step of the iterative algorithm. In particular, in this step selection is made of a higher full-scale value, that is incremented, with respect to the previous value, by the amount allowed by the variable-gain configuration of the amplification unit 7 of the conditioning stage 6.

The algorithm then returns to step 21, for execution of a new step of the iterative algorithm, and in particular for execution of a new measurement of the output signal Vout, in the presence of the new full-scale value previously selected. The algorithm thus proceeds iteratively, and by successive approximations, up to determination and selection of the optimized full-scale value that will enable execution of the measurements of magnetic field without saturation of the reading circuit 3.

Figure 4:
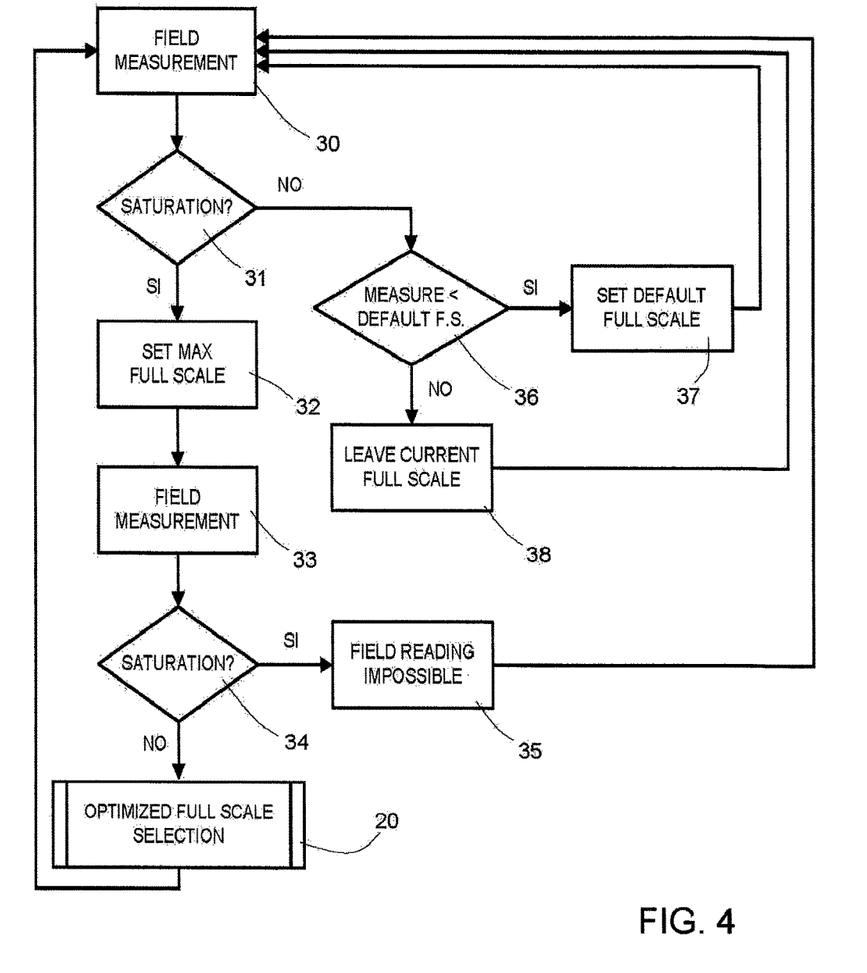

FIG. 4 shows a different embodiment of the algorithm executed by the full-scale-control stage 10, which envisages a continuous monitoring of the magnetic field and of the measurements made, in order to verify the presence of saturation and consequently select an optimized full-scale value. This algorithm moreover envisages return to a default measurement condition, once the atypical conditions that have led to the saturation cease.

The algorithm envisages performing, in a continuative way, a measurement of the magnetic field, for example, with a selected data rate, at step 30, and checking the value of the output signal Vout.

In the case where the presence of saturation is determined, in a step 31 following step 30, the algorithm envisages first a preliminary step of verification of feasibility of the automatic full-scale selection, such as to enable, advantageously, a reduction of the execution time and to prevent false readings.

In particular, the maximum full-scale value is set (step 32), and a new measurement of the magnetic field is made (step 33), thus obtaining a corresponding output signal Vout.

If this measurement causes a saturation of the output, as verified in step 34 following step 33, the algorithm determines the impossibility of proceeding with the optimal full-scale selection (given that reading without saturation has not been possible, even at the maximum implementable full-scale value). The algorithm can envisage (step 35), sending of an appropriate signal to the outside (for example, in the form of a flag or interrupt), so as to show the impossibility of performing correct magnetic field measurements.

Instead, if in step 34 the presence of saturation at output is not verified, the determination of an optimized full-scale value is initiated for the current conditions of measurement. For this purpose, the algorithm 20 for optimized full-scale selection, illustrated previously with reference to FIG. 3, can be executed. Alternatively, the full-scale-control stage 10 can be configured in such a way as to be able, as a function of the value of the field measured, to select directly an appropriate full-scale value from among the ones that can be implemented in the conditioning stage 6, for example by selecting the full-scale value higher than, and closest to, the value of the measured field.

If instead, at step 31, the presence of saturation is not verified, the algorithm also verifies whether the field detected has returned into "normal" conditions, i.e., whether it is lower than the default full-scale value envisaged as per design (step 36 following upon step 31).

In the case where this condition is verified, the full-scale-control stage 10 once again modifies (step 37) the command signal FS, in such a way as to vary the full scale of the conditioning stage 6, bringing it back to the default value. In this way, the electrical performance of the reading circuit 3, in terms of resolution and sensitivity, is advantageously brought back to the optimized values envisaged at the design stage for the usual conditions of measurement.

Otherwise, in the case where the field detected is not lower than the default full-scale value as per design, the algorithm leaves unaltered (step 38 following upon step 36) the current full scale, which is still adequate for the current conditions of measurement (it being for example the result of a previous selection that has solved a situation of saturation).

In any case, the algorithm returns to the step 30, for execution, according to the monitoring rate envisaged, of a new measurement of the magnetic field, so as to monitor and continuatively select the full scale optimized for the current, and possibly changed, conditions of measurement. The termination of the algorithm can be in this case caused by means of an appropriate interrupt signal received from the outside.

Figure 5:
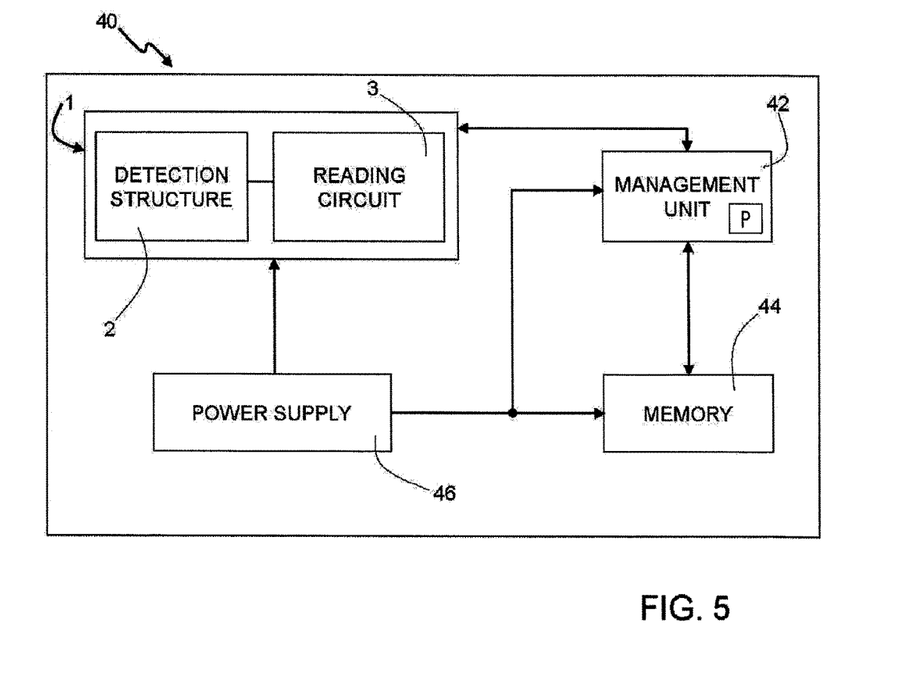
FIG. 5 shows a simplified block diagram of an electronic device including the magnetic-field sensor of FIG. 2.

FIG. 5 is a schematic illustration of an electronic device 40, for example, a cell phone or a similar electronic portable device, in which the magnetic-field sensor 1, and in particular the corresponding detection structure 2 and the corresponding reading circuit 3, are used, for example as a compass.

The electronic device 40 comprises a management unit (for example, including a microprocessor P) 42, connected to the reading circuit 3 of the magnetic-field sensor 1, in particular for controlling the operations of the reading circuit 3 (and possibly, via the enabling information EN, activating the procedure of selection of the optimized full-scale value), and for acquiring and possibly further processing the output signal Vout supplied (in analog or digital format) by the reading circuit 3, once the appropriate full-scale value of the conditioning stage 6 has been selected. In a way not illustrated, the management unit 42 can moreover be configured so as to co-operate with a user interface of the electronic device 30, amongst other things for receiving from the same user, a request for activating the procedure of selection of the optimized full-scale value.

The electronic device 40 further comprises a memory 44 (optional), and a supply source 46, connected to the magnetic-field sensor 1, to the management unit 42, and to the memory 44, to provide the power supply required for their operation; the supply source 46 may comprise, for example, a battery which provides the aforesaid supply voltage $V_s$ for the magnetic-field sensor 1.

The electronic device 40 may comprise further magnetic-field sensors 1, and corresponding reading circuits 3, in order to carry out a detection along a number of measurement axes, for example the axes of a set of three Cartesian axes x, y, z, for providing a triaxial system of detection of external magnetic fields. In a known way, three magnetic-field sensors 1 are sufficient to identify three spatial components of an external magnetic field $H_e$, uniquely identifying the direction and intensity thereof. In this case, the electronic device 40 may further comprise a position-detection system, for example, including an accelerometer, configured for detecting orientation of the electronic device with respect to the Earth's surface.

Advantages of some embodiments of the reading circuit, and of the corresponding magnetic-field sensor, emerge clearly from the foregoing description.

For example, the presence of the full-scale-control stage 10 integrated in the reading circuit 3 of the magnetic-field sensor 1 facilitates automatic selection of an optimized full-scale value for detecting and reading the magnetic-field signals, preventing saturation of the reading circuit 3 and at the same time facilitating optimized electrical performance as a function of the conditions of detection (and in particular of the stray magnetic fields present in the measurement environment and acting as offset superimposed on the useful signal). This selection may be advantageously carried out within the same magnetic-field sensor 1 (at the level of the ASIC, i.e., in the integrated circuit associated, in the same package, to the detection structure 2 of the magnetic-field sensor 1), so that further processing operations by an external electronic unit are not required.

The procedure of selection of the optimized full-scale value can be conveniently carried out without any external intervention by a user (who in particular is not required either to perform the selection of the full-scale value to be used for the detection or to make any measurement of the stray magnetic field present in the measurement environment). In addition, the algorithm of optimization of the full-scale value can be conveniently executed on demand, whenever desired by the user, or else continuatively or periodically, during operation of the electronic device incorporating the magnetic-field sensor.

It is clear that modifications and variations may be made to what has been described and illustrated herein, without thereby departing from the scope of the present disclosure, as defined in the annexed claims.

In particular, it is evident that the circuit implementation of the conditioning stage 6, and the effective implementation of the variation of the measurement full scale, may vary with respect to what is described and illustrated. In particular, the reading circuit 3, in an alternative embodiment, may not comprise the analog-to-digital conversion unit 9. In this case, the output signal Vout may be a signal of an analog type, and the digital conversion can possibly be carried out externally to the magnetic-field sensor 1. The control stage 10 verifies in this case saturation of the output signal Vout, in a way in itself known, for example, by verifying approaching of the same signal to the supply voltage of the reading circuit 3 (or crossing of a given saturation threshold by the same output signal).

The algorithm of selection of the optimized full-scale value may differ from the one described and illustrated; for example, the algorithm may envisage the use of a dichotomic technique (of a known type) for identifying, by successive approximations, the optimized full-scale value, or else, the algorithm may envisage the use, at start-up, of a maximum full-scale value, and then reduce this full-scale value in successive decrement steps, until a value is determined such as to cause saturation of the reading circuit 3 (at that point selecting for measurement the full-scale value determined at the preceding step by the iterative algorithm).

The circuit according to an embodiment may moreover be used in further magnetic-field sensors comprising magnetoresistive elements (or at least one magnetoresistive element) in a configuration different from the one described, or else elements for detection of magnetic field of different type, in general for the making of magnetic sensors, compasses, and magnetometers.

Some embodiments may take the form of or comprise computer program products. For example, according to one embodiment there is provided a computer readable medium comprising a computer program adapted to perform one or more of the methods or functions described above. The medium may be a non-transitory medium such as a physical storage medium, for example, a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, state machines, standard integrated circuits, controllers (e.g., programmed by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   signal processing circuitry configured to receive a detection signal indicative of one or more characteristics of a magnetic field and to generate an output signal as a function of said detection signal, the signal processing circuitry having a range of full-scale gain settings; and
   control circuitry communicatively coupled to said signal processing circuitry, wherein the control circuitry, in operation, automatically selects a full-scale gain setting of the range of full-scale settings of the signal processing circuitry, the selecting including responding to detection of saturation of the signal processing circuitry by iteratively selecting full-scale gain settings of the range of full-scale gain settings of said signal processing circuitry, until an absence of saturation of said signal processing circuitry at the selected full-scale gain setting of the signal processing circuitry is detected, and saturation of the signal processing circuitry is detected based on the output signal of the signal processing circuitry.

2. The device according to claim 1 wherein said control circuitry is configured to generate and to send to said signal processing circuitry a command signal based on the selected full-scale gain setting of said signal processing circuitry.

3. The device according to claim 2 wherein said signal processing circuitry comprises an amplifier having an electronically variable and selectable amplification gain, and said amplifier is configured to vary a value of said amplification gain based on the command signal, the iteratively-selected full-scale gain setting being a minimum setting selected from a set of settings of the range of full-scale gain settings which prevents saturation of the signal processing circuitry.

4. The device according to claim 1 wherein said iteratively selecting comprises:
   selecting a first full-scale gain setting;
   determining whether saturation of the signal processing circuitry is present at the first full-scale gain setting based on the output of the signal processing circuitry; and
   when it is determined that saturation of the signal processing circuitry is present, incrementing the first full-scale gain setting.

5. The device according to claim 4 wherein said first full-scale gain setting is one of: a minimum selectable setting and a default setting.

6. The device according to claim 1 wherein said control circuitry is activated in response to reception of an indication of a user demand.

7. The device according to claim 1 wherein said magnetic field comprises a useful component and a component of disturbance.

8. A system, comprising:
   a detection structure configured to generate an electrical detection signal as a function of a magnetic field; and
   reading circuitry configured to:
      generate an output signal based on the electrical detection signal generated by the detection structure; and
      automatically select a full-scale gain setting of a range of full-scale gain settings of the reading circuitry based on the output signal, wherein said reading circuitry is configured to respond to detection of saturation of the reading circuitry by iteratively selecting full-scale gain settings of the range of full-scale gain settings until an absence of saturation of said reading circuitry is detected, and to detect saturation of the reading circuitry based on the output signal.

9. The system according to claim 8 wherein said reading circuitry is configured to generate a command signal based on the selected full-scale gain setting.

10. The system according to claim 9 wherein said reading circuitry comprises an amplifier having an electronically variable and selectable amplification gain, and said amplifier is configured to vary a value of said amplification gain based on the command signal, the iteratively-selected full-scale gain setting being a minimum setting selected from a set of settings of the range of full-scale gain settings which prevents saturation of said reading circuitry.

11. The system according to claim 8 wherein said iteratively selecting comprises:
    selecting a first full-scale gain setting;
    determining whether saturation of the reading circuitry is present at the first full-scale gain setting based on the output signal; and
    when it is determined that saturation of the reading circuitry is present, incrementing the first full-scale gain setting.

12. The system according to claim 11 wherein said first full-scale gain setting is one of: a minimum selectable setting and a default setting.

13. The system according to claim 8 wherein said detection structure comprises magnetoresistive elements configured to form a bridge detection structure and said electrical detection is a signal indicative of an unbalancing of said bridge detection structure.

14. A method, comprising:
    receiving an electrical detection signal indicative of at least one characteristic of a magnetic field;
    generating, using a reading circuit, an output signal based on the electrical detection signal, the reading circuit having a range of full-scale gain settings; and
    automatically selecting a full-scale gain setting of the range of full-scale gain settings of said reading circuit based on the output signal, wherein the selecting the full-scale gain setting comprises responding to detection of saturation of the reading circuit by iteratively selecting full-scale gain settings of said reading circuit until an absence of saturation of said reading circuit is detected, and saturation of the reading circuit is detected based on the output signal of the reading circuit.

15. The method of claim 14 wherein the iteratively-selected full-scale gain setting is a minimum setting from a set of settings at which saturation of said reading circuit is not detected.

16. The method of claim 14 wherein said iteratively selecting comprises:
    selecting a first full-scale gain setting;
    determining whether saturation is present at the first full-scale gain setting based on the output of the reading circuit; and
    when it is determined that saturation is present, incrementing the first full-scale gain setting.

17. The method of claim 16 wherein said first full-scale gain setting is one of: a minimum selectable setting and a default setting.

18. The method of claim 14, further comprising:
    generating the electrical detection signal.

* * * * *

UNITED STATES PATENT AND TRADEMARK OFFICE
CERTIFICATE OF CORRECTION

PATENT NO. : 10,473,731 B2
APPLICATION NO. : 13/302944
DATED : November 12, 2019
INVENTOR(S) : Carlo Alberto Romani et al.

Page 1 of 1

It is certified that error appears in the above-identified patent and that said Letters Patent is hereby corrected as shown below:

On the Title Page

Item (75) Inventors:
"Carlo Alberto Romani, Comaredo (IT); Enrico Pozzati, San Martino Siccomario (IT); Fabio Bottinelli, Malnate (IT)"
Should read:
--Carlo Alberto Romani, Comaredo (IT); Enrico Pozzati, Cava Manara (IT); Fabio Bottinelli, Malnate (IT)--.

Item (56), References Cited, Foreign Patent Documents:
"JP WO 2009154095 A1* 12/2009 ........... G01R 33/063"
Should read:
--WO 2009154095 A1* 12/2009 ........... G01R 33/063--.

Signed and Sealed this
Twenty-first Day of April, 2020

Andrei Iancu
*Director of the United States Patent and Trademark Office*